(12) United States Patent
Diepold et al.

(10) Patent No.: US 11,337,299 B2
(45) Date of Patent: May 17, 2022

(54) DISSIPATING HEAT FROM AN ELECTRONIC ASSEMBLY USING FORCED CONVECTION, AND METHOD FOR DISSIPATING HEAT FROM AN ELECTRONIC ASSEMBLY

(71) Applicant: Siemens Aktiengesellschaft, Munich (DE)

(72) Inventors: Fabian Diepold, Altmannstein (DE); Alexander Kiesel, Erlangen (DE); Benno Weis, Hemhofen (DE); Johannes Fürst, Stöckelsberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/428,202

(22) PCT Filed: Jan. 29, 2020

(86) PCT No.: PCT/EP2020/052168
§ 371 (c)(1),
(2) Date: Aug. 3, 2021

(87) PCT Pub. No.: WO2020/160978
PCT Pub. Date: Aug. 13, 2020

(65) Prior Publication Data
US 2022/0046786 A1 Feb. 10, 2022

(30) Foreign Application Priority Data
Feb. 4, 2019 (EP) .................................. 19155237

(51) Int. Cl.
*H05K 1/02* (2006.01)
*H05K 1/18* (2006.01)

(52) U.S. Cl.
CPC ........... *H05K 1/0206* (2013.01); *H05K 1/181* (2013.01)

(58) Field of Classification Search
CPC ............................ H05K 1/0206; H05K 1/181
(Continued)

(56) References Cited

U.S. PATENT DOCUMENTS 5,986,887 A * 11/1999 Smith ................ H05K 7/20509
165/185
8,289,715 B2 * 10/2012 Takahara ........... H05K 7/20972
361/721

(Continued)

FOREIGN PATENT DOCUMENTS

| CN | 106486433 A | 3/2017 |
| DE | 19910500 A1 | 10/2000 |

(Continued)

OTHER PUBLICATIONS

PCT International Search Report and Written Opinion of International Searching Authority dated Jan. 27, 2021 corresponding to PCT International Application No. PCT/EP2020/052168 filed Feb. 4, 2019.

*Primary Examiner* — Sherman Ng
(74) *Attorney, Agent, or Firm* — Henry M. Feiereisen LLC (57) ABSTRACT

An electronic assembly has a printed circuit board with first and second component sides. A cooling element on the first component side is cooled by forced convection produced by a convection unit. A majority of electronic components are arranged on the second component side. Non-current-conducting plated-through holes are used to transport thermal energy generated by an electronic component from the second component side to the first component side. The thermal energy can be transported away from the printed circuit board and dissipated by means of the forced convec- (Continued)

tion. A corresponding method for dissipating heat from an electronic assembly is also disclosed.

12 Claims, 3 Drawing Sheets

(58) Field of Classification Search
USPC .......................................................... 361/720
See application file for complete search history.

(56) References Cited

U.S. PATENT DOCUMENTS

| | | |
|---|---|---|
| 8,743,540 B1 * | 6/2014 | Nishihara .......... H05K 7/20572 361/692 |
| 10,182,494 B1 | 1/2019 | Jacobbson et al. |
| 2005/0270749 A1 * | 12/2005 | Verbist ................. H05K 1/0203 361/720 |
| 2006/0006525 A1 | 1/2006 | Mullen et al. |
| 2018/0310396 A1 | 10/2018 | Kobayashi et al. |

FOREIGN PATENT DOCUMENTS

| | | |
|---|---|---|
| DE | 10033352 A1 | 1/2002 |
| DE | 102014205411 A1 | 9/2015 |
| EP | 3358917 A1 | 8/2018 |

* cited by examiner

DISSIPATING HEAT FROM AN ELECTRONIC ASSEMBLY USING FORCED CONVECTION, AND METHOD FOR DISSIPATING HEAT FROM AN ELECTRONIC ASSEMBLY

CROSS-REFERENCES TO RELATED APPLICATIONS

This application is the U.S. National Stage of International Application No. PCT/EP2020/052168, filed Jan. 29, 2020, which designated the United States and has been published as International Publication No. WO 2020/160978 A1 and which claims the priority of European Patent Application, Serial No. 19155237.1, filed Feb. 4, 2019, pursuant to 35 U.S.C. 119(a)-(d).

BACKGROUND OF THE INVENTION

The invention relates to an electronic assembly and a method for cooling an electronic assembly.

Present day frequency converters are constructed with standard silicon IGBT modules. Novel power semiconductors, gallium nitride (GaN) having a large band gap, for example, are mostly available as discrete components. One of the main problems is the cooling of the switching and conducting losses. The switching losses are particularly high in the case of hard switching, which means that both the switching frequency and also the conducting current are thermally limited depending on the switch technology. This increases the need for skillful cooling of the power semiconductors. In contrast to present day power modules, this novel component is mostly a discrete switch that is soldered onto a carrier material.

These novel power semiconductor switches, in particular GaN switches, are often offered as Surface Mounted Device (SMD) components, wherein the electrical connections are only made on one side. The current direction in the case of these switches is horizontal instead of vertical as is the case with conventional IGBTs. The new power semiconductor switches are discrete and laterally constructed switches. These power semiconductor components are available, inter alia, in SMD design and available with a soldering pad on the bottom and/or top side, said soldering pad being used as a contact surface for the cooling surface. Although the total losses can be reduced due to the new technology, the component size is also small, as a result of which the area-related energy loss is still high. In addition, the novel power semiconductor switches are operated with high switching frequencies. Although these high switching frequencies lead to higher losses, they do create new advantages.

A power section comprises at least one power semiconductor switch. In addition, with increasing miniaturization of the components, the power semiconductor switches are moving ever closer to one another and also changes to the system are often necessary in terms of electromagnetic compatibility.

Present day power semiconductors in drive applications are mostly insulated gate bipolar transistors (IGBTs). These are often combined in one module in frequency converters. In this case, the power semiconductors are attached to an insulating substrate (=DCB (Direct Copper Bonded)), wherein the underside of the substrate makes contact with the cooling element over a large area. In order to improve the heat transfer between the module and the cooling element, heat-conducting paste is usually applied to the contact surface. The entire power loss is thereby dissipated to a massive cooling element that is generally part of the entire housing. This solution is particularly restricted by the system omit of the module, which is to be seen as a limiting factor in the case of the novel components.

In a further solution, the semiconductors can be attached as an SMD component to the printed circuit board. The voltage differences between the electrical potentials on the printed circuit board are selected to be as small as possible in order to be able to realize a compact assembly. Ideally, only the necessary air distances and creepage distances are provided. For cooling, the surface of this printed circuit board can now be cooled using an air stream. The disadvantage of this solution is that the cooling air exposes the top of this printed circuit board to dirt particles that are deposited on the open pins of the components and lead to a short circuit when two potentials are connected. Therefore, this type of cooling procedure leads to a reduced service life of the assembly.

US 2018/0310396 A1 discloses a cooling element structure of a printed circuit board module, said cooling element structure comprising a printed circuit board on which an electronic component is mounted and said cooling element structure comprising an electronic device. A first electronic component that is mounted on a front side of the printed circuit board can be cooled during operation in that the occurring heat loss of the first electronic component can be conveyed by means of plated-through holes of the printed circuit board to a cooling element that is mounted on the rear side of the printed circuit board.

US 2006/0006525 A1 discloses various systems for dissipating heat loss of a semiconductor module that is arranged in a computer system. Many of these systems have a semiconductor module that is located on one side of a printed circuit board, and have a cooling element for dissipating the heat loss of the semiconductor module that is located on the other side of the printed circuit board. One or multiple thermal plated-through holes extend through the printed circuit board in order to thermally couple the semiconductor module to the cooling element. Such systems thus improve the overall thermal housekeeping of the semiconductor module by making it easier to dissipate its heat loss through the printed circuit board.

The object of the present invention is to provide an electronic assembly and a method with which, in particular, SMD power semiconductor switches can be cooled without reducing the service life of the electronic assembly.

SUMMARY OF THE INVENTION

This object is achieved by an electronic assembly and a method according to the independent claims. Expedient developments are disclosed in the subordinate claims.

One aspect of the invention relates to an electronic assembly having a printed circuit board, which is embodied with a first and a second component side, and at least one first cooling element that is arranged on the first component side. Multiple electronic components are also arranged, a plurality of which is located on the second component side of the printed circuit board. The electronic assembly comprises at least one first plated-through hole of the printed circuit board, said plated-through hole being used to transport a generated thermal energy of the first electronic component from the second component side to the first component side. The electronic assembly further comprises a convection unit for generating a forced convection exclusively on the first component side and said convention unit renders it possible to transport the thermal energy away from the printed circuit board of the electronic assembly with the result that the electronic assembly can be cooled. As a result of the forced convection generated exclusively on the first component side, in particular the thermal energy or heat can be transported away from the assembly. Since the plurality of the electronic components is arranged on the second component side that is not subjected to the forced convection, there can be no or only a small accumulation of dirt particles on current-conducting components. Owing to the lower exposure to dirt particles, the service life of the printed circuit board and thus of the entire electronic assembly is generally extended but above all the service life is not shortened as a result. The few electronic components that are arranged on the first component side can be placed on the first component side in such a manner that they are at a large distance from one another. As a result, no conductive connections can arise between the individual electronic components due to the transported dirt particles of the forced convection and this can ensure that the service life of the electronic assembly is not reduced. In particular, natural convection takes place on the second component side that is formed with a plurality of the electronic components. The natural convection is achieved by the natural air flow in the vicinity of the second component side. As a result, part of the generated thermal energy in particular can be transported away from the printed circuit board.

The electronic assembly can be, for example, a DC/DC converter and/or a frequency converter or converter. The printed circuit board serves as a dividing plane between the natural convection on the second component side and the forced convection on the first component side.

Convection or heat flow is to be understood to mean that a method and/or a mechanism are used to achieve a heat transfer of energy from one place to another.

In particular, the first component side has the first cooling element that can emit the generated thermal energy into a space of the forced convection with the result that the thermal energy can be transported away by the forced convection. The convection unit for generating the forced convection is, if possible, to be arranged in such a manner that the air flow generated by the forced convection acts exclusively on the first component side without this having an effect on the second component side. This is intended in particular to ensure that the possible dirt particles occur exclusively on the first component side, on which in particular no current-conducting components are arranged. In particular, the thermal energy or the heat from the printed circuit board of the electronic assembly can be transported away using forced convection or using natural convection.

The convection unit can be, for example, a ventilation unit or a ventilator, such as a fan, in particular a lamella fan, an axial fan, a radial fan, a diagonal fan, or a cross-flow fan. These examples are not intended to be understood as exhaustive but are merely intended to represent a large number of different embodiments of the convection unit. In particular, artificial convection can be generated using the convection unit.

The plated-through holes are used for the intended purpose that the generated thermal energy can be transferred to the first component side by the electronic components that in particular conduct current and are arranged on the second component side. The plated-through hole in particular can be a copper plated through-going hole in the printed circuit board. For example, the copper plated through-going hole in the printed circuit board can be filled with solder. The plated-through holes can be in particular so-called vias. The plated-through holes are used to transfer the thermal energy or the heat from the second component side to the first component side. In particular, heat conduction or heat transfer of the generated thermal energy is achieved using the first plated-through hole. In particular, the first plated-through hole is required because the printed circuit board of the electronic assembly itself does not conduct heat well.

For example, the electronic components can be logic circuits or power supply lines or power supply tracks or measuring components or power semiconductor switches or power switches or IGBTs or MOSFETs.

It is preferably provided that the multiple electronic components and the at least first cooling element are embodied based on surface mounted technology. By using surface mounted technology, the electronic components do not require any wire connections that have to be inserted through the printed circuit board with the result that the plurality of the electronic components can be arranged on the second component side of the printed circuit board and thereby the cooling procedure can be carried out by the forced convection on the first component side with the result that the electronic components are not exposed to dirt particles. The electronic components and the at least first cooling element are built using SMD technology. In the case of SMD technology, the SMD components are no longer attached using wire connections but are attached directly on the first and/or second component side of the printed circuit board by means of solderable connection surfaces. Surface mounted technology SMT (Surface-Mount Technology) is used for this. By using SMD components, a most space-saving structure possible for the electronic assembly can be achieved and a low thermal resistance to the printed circuit board can be guaranteed. Owing to the ever-increasing miniaturization of the peripheral components, packing densities in particular are increasingly greater and as a consequence the heat dissipation is reduced. Therefore, the generated thermal energy of the second component side is transported away to the first component side with the help of the plated-through hole with the result that the forced convection of the first component side can dissipate the thermal energy from the electronic assembly with the result that the electronic assembly is cooled.

In a further advantageous embodiment of the invention it is provided that the at least first cooling element is embodied as a flat conductor track or as a metal housing or as a metal cooling element. In order to be able to dissipate the thermal energy that is transferred from the second component side to the first component side as efficiently as possible by the forced convection, the at least first cooling element is used. The first cooling element that is embodied in particular as an SMD cooling element is preferably mounted on the first component side in such a manner that said first cooling element is arranged on the opposite side in the heat path of the electronic components that generate the thermal energy. Depending on the area available on the electronic assembly or on the printed circuit board, the cooling element can be embodied as a flat conductor track or as a flat copper strip, which means that as little installation space as possible is required. In order to be able to give off as much thermal energy as possible, the cooling element can be embodied as a metal housing that is preferably made of copper or aluminum. This means that thermal energy can be transported away from the printed circuit board by the forced convection.

In an advantageous embodiment, it is provided that the first plated through-hole is arranged parallel to at least one second plated-through hole of the printed circuit board adjacent to one another. In order to be able to achieve the best possible heat conduction of the thermally generated energy from the second component side to the first component side, multiple plated-through holes, in particular the first and second plated-through holes, are arranged in parallel adjacent to one another. Multiple plated-through holes can preferably also be arranged in parallel adjacent to one another. The more plated-through holes that are arranged parallel to one another, the better the thermal energy can be given off from the second component side to the first component side. The better the thermal energy can be transferred from the second component side to the first component side, the more the service life of the electronic assembly can be increased. For example, the first plated-through hole and the second plated-through hole can be arranged in such a manner that they are parallel to one another and are arranged on one component of the multiple components.

It is preferably provided that the first plated-through hole and/or the second plated-through hole are arranged on the printed circuit board as close as possible to one or a group of the multiple electronic components and insulated from electrical conductor tracks or also connected to electrical conductor tracks of the same potential. In order to achieve the best possible cooling of the electronic components, the first plated-through hole and/or the second plated-through hole are to be arranged as close as possible to one or a group of electronic components while maintaining electrical and mechanical conditions. As a result, the thermal energy that is generated by the electronic components can be transferred using the first and/or the second plated-through hole from the second component side to the first component side. Thus, the thermal energy can be transported to the first component side as efficiently as possible by the forced convection.

The arrangement of the first plated-through hole and the second plated-through hole depends on specific conditions or standards in the manufacture of the printed circuit board of the electronic assembly. In certain cases, the first and/or the second plated-through hole can only be arranged so close to the electronic component that certain insulation distances between the plated-through hole and the electronic component can be maintained. The electronic components and the plated-through hole are also to be arranged in such a manner that they have a sufficient distance from the current-conducting conductor track so that no flashovers can occur. In particular, the DRC (Design Rule Check) and the ERC (Electrical Rule Check) can be used in the case of the arrangement of the first plated through-hole and the second plated-through hole on the electronic components. These are mainly used for layout verification when creating the layout of the printed circuit board. The arrangement of the first and/or the second plated-through hole is to be arranged as close as possible to the electronic component, on the one hand so that the standards and conditions for creating the layout of the printed circuit board are guaranteed and also on the other hand so that the generated thermal energy can be easily dissipated. In particular, aspects of electromagnetic compatibility must also be taken into consideration in the case of the arrangement of the first plated-through hole and in the case of the second plated-through hole on the electronic components.

It is preferably provided that the first plated-through hole is embodied to conduct current and is coated with an electrically insulating layer on the second component side of the printed circuit board, whereas the second plated-through hole is not embodied to conduct current and, where appropriate, is not coated with the electrically insulating layer. For example, the insulating layer can be embodied as an interface material between the cooling element and the printed circuit board. In particular, the first plated-through hole and/or the second plated-through hole can be used primarily for the heat transfer of the thermal energy from the second component side to the first component side. Likewise, however, the first plated-through hole can also be embodied to conduct current and, for example, supply various electronic components with current. Since the first plated-through hole and the second plated-through hole can be arranged spatially without a great distance from one another and the first plated-through hole and the second plated-through hole can be at different potentials, a short circuit can occur in the event of a fault, tn order to be able to prevent a short circuit between the first plated-through hole and the second plated-through hole or between the first plated-through hole and/or the second plated-through hole to another electronic component, in particular the current-conducting first plated-through hole is coated with an electrically insulating layer. This electrically insulating layer ensures that there can be no short circuit between the first plated-through hole and the second plated-through hole on the first component side. In particular, the coating of the insulating layer is only provided on the side of the plated-through hole which is in contact with the first component side. In particular, the second plated-through hole that is not current-conducting but is embodied for the heat transfer of the thermal energy is not to be coated with the electrically insulating layer. The second plated-through hole is therefore not coated with the layer because, although the electrically insulating layer ensures good electrical insulation, it does cause the heat transfer to be performed poorly or for the extent of the heat transfer to deteriorate. As a result, in an emergency, not enough heat can be transported away from the electronic component.

In an advantageous embodiment of the invention, it is provided that the electrically insulating layer is embodied as an insulating film or as an insulating lacquer. In order to be able to protect the heat-conducting plated-through holes in particular against an electrical flashover, the current-conducting plated-through holes are coated with an electrically insulating layer, wherein the electrically insulating layer is preferably embodied as an insulating film or as an insulating lacquer. The insulating film can be used in particular if, for example, the complete or only partial areas of the first component side are to be coated with the insulating layer. The insulating film can be applied efficiently to the entire first component side. In contrast, the insulating lacquer has the advantage that only the plated-through holes that are embodied for conducting current can be coated with the insulating layer in a targeted manner.

It is further provided that the first cooling element is allocated to a first electronic component, and/or a second electronic component that is arranged on the first component side or on the second component side is allocated a second cooling element on the first component side, and/or the first electronic component and the second electronic component are allocated the first cooling element or the second cooling element.

In order to achieve a most efficient possible cooling of the printed circuit board or the electronic assembly, a cooling element on the first component side can be allocated for example to each electronic component, in particular to each power semiconductor switch. In particular, the first cooling element is arranged in such a manner that it is arranged opposite the first electronic component. Likewise, the second cooling element can be arranged on the first component side in such a manner that said second cooling element is placed opposite the second electronic component. For example, one and the same cooling element can be allocated to the first electronic component and the second electronic component with the result that in particular the cooling elements can be arranged in a space-saving manner on the first component side and, depending on the space requirements, savings can be made in the number of cooling elements. In particular, it can also be possible for the first electronic component that is a power semiconductor to be arranged on the first component side, wherein the first cooling element is arranged directly on the first electronic component on the first component side. As a result, any thermal energy that occurs can be optimally dissipated and transported away with the air flow of forced convection. For example, the first or the second cooling element can be embodied as a flat conductor track with the result that both the first electronic component and the second electronic component can be cooled using this flat conductor track.

It is provided that a first potential is provided for a first cooling element and a second potential that is different from the first potential is provided for the second cooling element, or the first cooling element and the second cooling element are connected to the first potential or to the second potential. In particular, it is possible to use SMD cooling elements that are at a certain potential to achieve new freedoms in the structure of the electronic assembly. This can lead to smaller dimensions of the electronic assembly and to an increase in the performance of the electronic assembly. The fact that the first cooling element is provided with the first potential and the second cooling element is provided with the second potential means that there is no need for a large cooling element at ground potential, wherein as a result it is possible to improve compliance with the electromagnetic compatibility standards for the increased switching frequencies on the electronic assembly. By using different potentials, parasitic capacitances from the electronic assembly to the first and/or to the second cooling element can be omitted. In particular, the first and/or the second potential do not necessarily have to be the ground potential but can be any fixed or varying potential. The first and/or the second potential of the first and/or the second cooling element are each independent of one another and can differ from the respective other potential. As a result, aspects of electromagnetic compatibility can be better taken into consideration when the electronic assembly is produced.

A further aspect of the invention relates to a method for cooling an electronic assembly that has a printed circuit board having a first or a second component side. The second component side can be cooled using a natural convection and thermal energy can be transported from the second component side to the first component side using a plated-through hole in the printed circuit board. Using a forced convection on the first component side, the thermal energy can be transported away from the printed circuit board with the result that the electronic assembly is cooled. Natural convection is the natural flow of air that can cool the second component side, in particular the electronic components on the second component side. The thermal energy that is generated in particular by electronic components on the second component side can be transported through plated-through holes, in particular copper plated-through holes, in the printed circuit board from the second component side to the first component side of the printed circuit board. The first component side is provided with a forced convection so that the thermal energy can be transported from the second component side on the first component side away from the printed circuit board. The forced convection is generated in particular by a convection unit. In particular, the convection unit creates an air flow which transports the thermal energy or heat away from the first component side with the result that in particular the printed circuit board of the electronic assembly can be cooled.

An independent aspect of the invention relates to an electronic assembly having a printed circuit board that is embodied with a first component side and a second component side. In particular, the printed circuit board comprises at least one first cooling element, which is arranged on the first assembly side, and multiple electronic components, a plurality of which a plurality is arranged on the second assembly side of the printed circuit board. Furthermore, the printed circuit board of the electronic assembly comprises can be transported. The printed circuit board comprises, for example, a cooling element that is embodied as a metal housing and is arranged on the first component side. The printed circuit board can also comprise a convection unit for generating a forced convection exclusively on the first component side, said convection unit rendering it possible to transport the thermal energy away from the printed circuit board of the electronic assembly with the result that the electronic assembly (1) can be cooled.

A further independent aspect of the invention relates to a method for cooling an electronic assembly which has a printed circuit board having a first component side and a second component side, wherein the second component side is cooled using natural convection. In particular, thermal energy is transported from the second component side using a current-conducting plated-through hole in the printed circuit board to the first component side and into a cooling element. Using a forced convection on the first component side, the thermal energy is in particular transported away from the printed circuit board and/or from the cooling element with the result that the electronic assembly is cooled.

The advantages and effects specified for the electronic assembly in accordance with the invention naturally apply equally to the method in accordance with the invention and vice versa. As a result, device features can of course also be formulated as method features and vice versa.

BRIEF DESCRIPTION OF THE DRAWING

Further advantages and features are disclosed in the following description of exemplary embodiments with the aid of the figures. In the figures, like reference symbols denote like features and functions.

In the drawings.

DETAILED DESCRIPTION OF PREFERRED EMBODIMENTS

Figure 1:
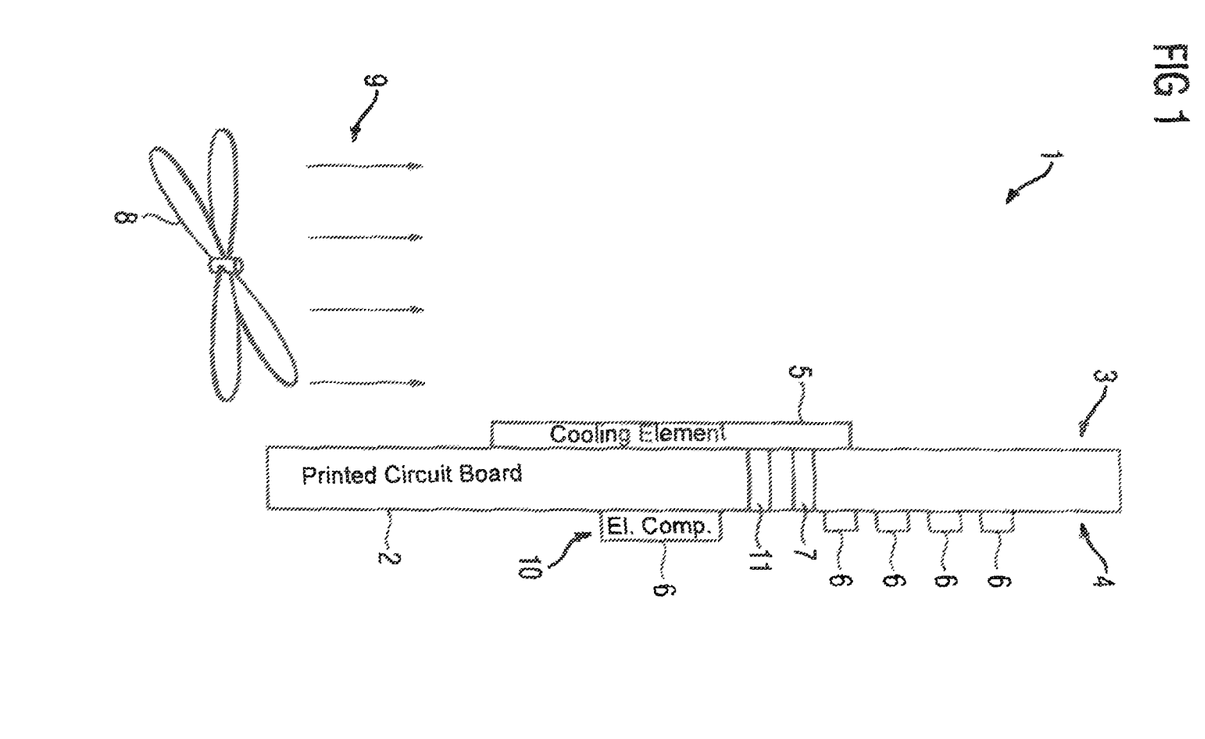
FIG. 1 shows a schematic illustration of the electronic assembly having a printed circuit board which comprises a first and a second component side.

FIG. 1 shows a schematic illustration of the electronic assembly 1 having a printed circuit board 2 that is embodied with a first component side 3 and a second component side 4. In particular, the first component side 3 of the printed circuit board 2 comprises a first cooling element 5. The printed circuit board 2 of the electronic assembly 1 comprises for example multiple electronic components 6, a plurality of which is arranged on the second component side 4 of the printed circuit board 2. The printed circuit board 2 comprises in particular a first non-current conducting plated-through hole 7 that is used to transport a generated thermal energy of a first electronic component 6 from the second component side 4 to the first component side 3. The electronic assembly 1 comprises in particular a convection unit 8 that renders it possible to generate a forced convection 9. The forced convection 9 is generated exclusively on the first component side 3 of the printed circuit board 2, said forced convection being used to transport the thermal energy away from the printed circuit board 2 of the electronic assembly 1 with the result that the electronic assembly 1 can be cooled. Using the forced convection 9, in particular, an air flow can be generated which only transports away the thermal energy or heat on the first component side 3 of the printed circuit board 2. The second component side 4 can for example have a natural convection that can be achieved by a natural air flow. As a result, part of the generated thermal energy in particular can already be dissipated with the result that in particular the electronic components 6 can be cooled.

The first plated-through hole 7 in particular can be a copper plated-through hole which is filled with solder for example. Using the first plated-through hole, the thermal energy of the second component side 4 can be transferred to the cooling element 5 of the first component side 3 in particular. The first cooling element 5 can then with the aid of the forced convection 9 transport the thermal energy away from the printed circuit board 2 with the result that the electronic assembly 1 can be cooled.

For example, the electronic components 6 and the first cooling element 5 can be embodied as SMD components. With the aid of SMD technology, it is possible in particular to achieve a miniaturization of the electronic assembly 1. By using SMD components, the electronic components 6 in particular can be mounted on the second component side 4 in a space-saving manner.

The electronic assembly 1 can be, for example, a converter or frequency converter. In particular, the electronic components 6 can be logic circuits, current-conducting components, measuring lines, conductor tracks, IGBTs or MOSFETs. In particular, the electronic assembly 1 can have a power semiconductor switch 10 as the electronic component 6. The examples of the electronic components 6 are not intended to be understood as exhaustive but are only intended to represent the large number of possible electronic components 6.

For example, the first cooling element 5 can be embodied as a flat conductor track or flat conductive surface. For example, the first cooling element 5 can also be embodied as a metal housing, wherein the housing of the first cooling element 5 can be made of copper or aluminum, for example.

For example, the first plated-through hole 7 can be arranged parallel to at least one second plated-through hole 11 of the printed circuit board 2 adjacent to one another. By arranging the first plated-through hole 7 and the second plated-through hole 11 on the printed circuit board 2 in parallel, an improved heat transfer of the thermal energy from the second component side 4 to the first component side 3 can be achieved. In particular, the first plated-through hole 7 and/or the second plated-through hole 11 can be arranged isolated from the electrical conductor tracks on the printed circuit board 2 as close as possible to one or a group of the multiple electronic components 6. In particular, although the first plated-through hole 7 and/or the second plated-through hole 11 are to be arranged as close as possible to one of the electronic components 6, it is necessary in doing so to take into consideration specific criteria and/or standards in the case of the layout of the printed circuit board 2. In this case, it is necessary in particular to observe insulation distances between the first plated-through hole 7 and/or the second plated-through hole 11 with the electronic component 6 or with a conductor track on the printed circuit board 2. Likewise, in the case of the arrangement of the first plated-through hole 7 or the second plated-through hole 11, aspects of the electromagnetic compatibility of the electronic assembly 1 must also be taken into consideration. Taking into consideration the criteria just known, the first plated-through hole 7 and the second plated-through hole 11 are to be arranged as close as possible to one of the electronic components 6 with the result that on the one hand the criteria can be met and on the other hand an efficient heat dissipation of the generated thermal energy to the first component side 3 can be carried out. For example, in some cases the first plated-through hole 7 and/or the second plated-through hole 11 can also be located directly under the electrical component 6 in order to improve the thermal dissipation of heat.

For example, the first plated-through hole 7 can be used to conduct current on the printed circuit board 2, wherein in this case in particular the area of the first plated-through hole 7 that is located on the first component side 3 of the printed circuit board 2 can be coated with an electrically insulated layer. In contrast, the second plated-through hole 11 which is not embodied to conduct current but is embodied to transport away the generated thermal energy is not coated with the electrically insulating layer. The electrically insulating layer prevents an electrical flashover or a short circuit from occurring between the first plated-through hole 7 and the second plated-through hole 11. The electrically insulating layer can be, for example, an insulating film or an insulating lacquer. For example, not only the current-conducting first plated-through hole 7 can be coated but part or the entire area of the first component side 3 can also be coated with the insulated layer.

Figure 2:
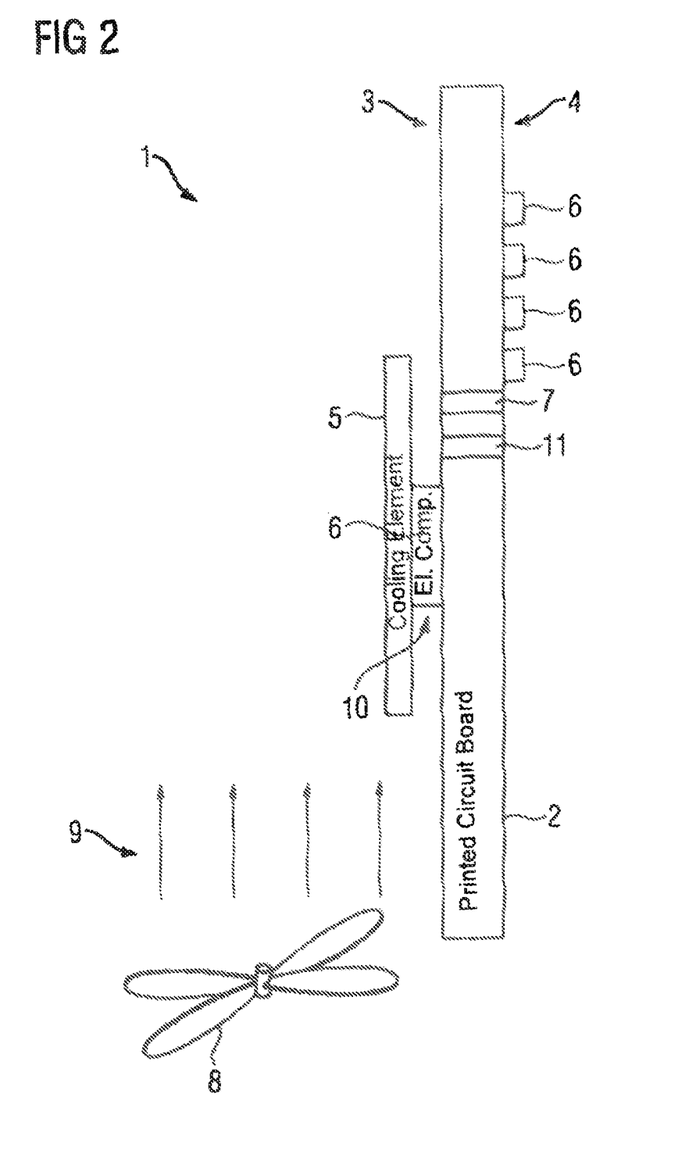
FIG. 2 shows a further schematic illustration of the electronic assembly having a printed circuit board, wherein in this case a cooling element and an electronic component are located on a first component side of the printed circuit board.

FIG. 2 shows a further schematic illustration of the electronic assembly 1 having the printed circuit board 2, wherein in this example the first cooling element 5 and the power semiconductor switch 10 as an electronic component 6 are located on the first component side 3 of the printed circuit board 2. In this case, the first cooling element 5 on the first component side 3 is allocated to the power semiconductor switch 10. As a result, the generated thermal energy of the power semiconductor switch 10 can be cooled with the aid of the cooling element 5 using the forced convection 9 that is generated by the convection unit 8. In particular, this results in improved heat dissipation of the generated thermal energy. For example, the power semiconductor switch 10 can only have pins on the underside of the power semiconductor switch 10, wherein the pins are at a sufficiently large distance from one another. In order to be able to protect the power semiconductor switch 10 against a short circuit or flashover, the pins of the power semiconductor switch 10 can be coated with the electrically insulating layer. If, for example, the pins of the power semiconductor switch 10 are coated with the layer, it is not necessary for the first cooling element 5 or the first component side 3 of the printed circuit board 2 themselves to be coated. In this example, logic circuits for example are located on the second component side 4 of the printed circuit board 2, said logic circuits also generating thermal energy which is transferred from the second component side 4 to the first component side 3 in particular by the first plated-through hole 7 and/or the second plated through hole 11. Using the forced convection 9, the thermal energy can then be transported away from the printed circuit board 2 with the result that the printed circuit board 2 and in particular the electronic assembly 1 can be cooled.

Figure 3:
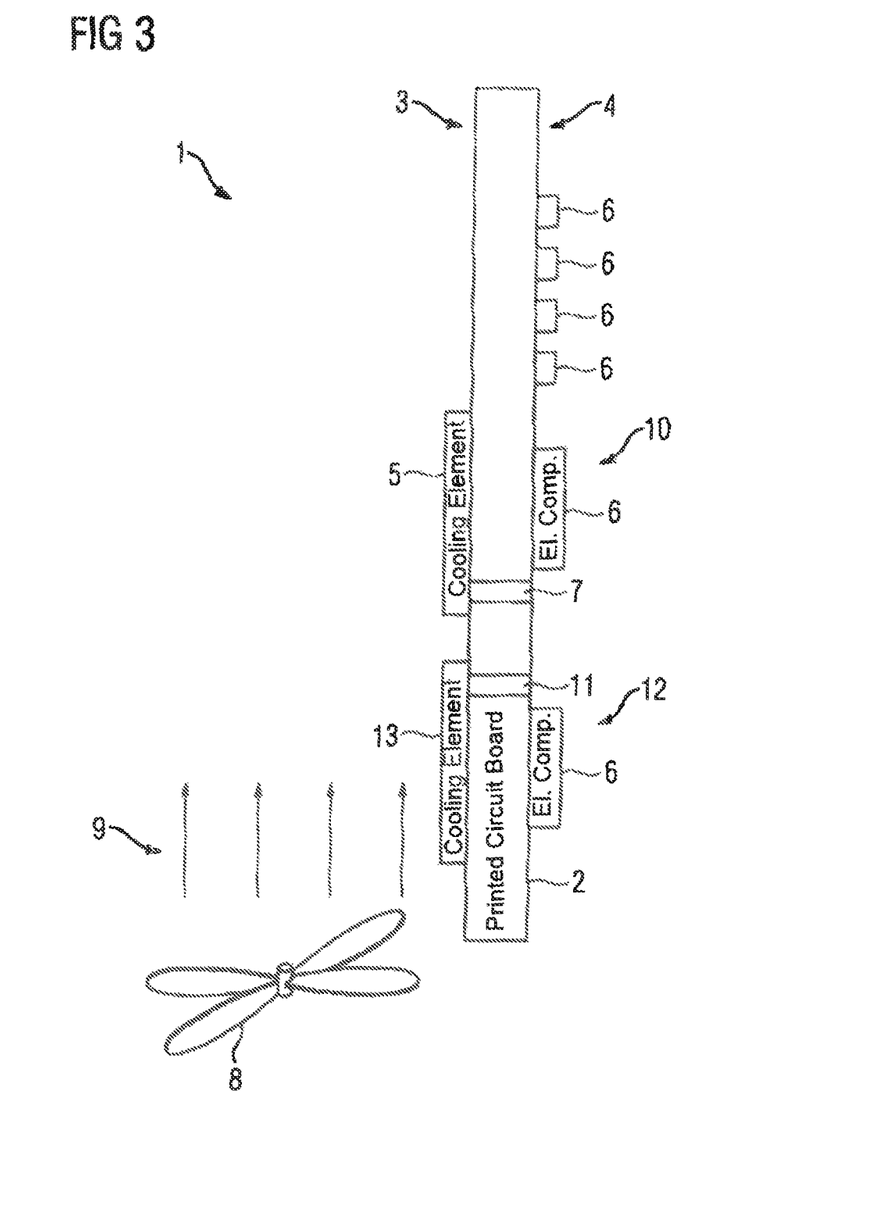
FIG. 3 shows a further schematic electronic assembly having a printed circuit board, wherein in this case the cooling elements are at different potentials.

FIG. 3 shows a further schematic illustration of the electronic assembly 1 having the printed circuit board 2, wherein in this example the first cooling element 5 can be allocated to the first electronic component 10 and a second cooling element 13 can be allocated to a further power semiconductor switch 12. In this example, the first cooling element 5 and the second cooling element 13 are located on the first component side 3 of the printed circuit board 2 and the power semiconductor switch 10 and the further power semiconductor switch 12 are located on the second component side 4 of the printed circuit board 2. For example, the first cooling element 5 can be allocated to a first potential and the second cooling element 13 can be allocated to a second potential that is different from the first potential. For example, it can also be provided that the first cooling element 5 and the second cooling element 13 are connected together either at the first potential or at the second potential.

In particular, the power semiconductor switch 10 can be allocated to the first cooling element 5. The first cooling element 5 and the power semiconductor switch 10 are located opposite one another. The further power semiconductor switch 12 can likewise be arranged opposite the second cooling element. For example, only either the first cooling element 5 and/or the second cooling element 13 can be allocated for the power semiconductor switch 10 and the further power semiconductor switch 12. In this case, the first cooling element 5 or the second cooling element 13 can be embodied as a flat conductor track for example. The first and/or the second potential do not necessarily have to be the ground potential but the first and/or the second potential can be any fixed or varying potential.

By allocating a separate cooling element 5, 13 for each power semiconductor switch 10, 12, the heat dissipation of the generated thermal energy can be optimally improved with the result that the heat can be transported away by the forced convection 9 on the first component side 3. For example, the first plated-through hole 7 can be made available to the power semiconductor switch 10 and the second plated-through hole 11 can be allocated to the further power semiconductor switch 12. It can thereby be achieved that the printed circuit board 2 and in particular the electronic assembly 1 can be optimally cooled.

What is claimed is:

1. An electronic assembly, comprising:
a printed circuit board having a first component side and a second component side,
a plurality of electronic components, with a majority of the electronic components disposed on the second component side,
at least one first plated-through hole disposed in the printed circuit board and configured to transport thermal energy generated by an electronic component disposed on the second component side from the second component side to the first component side,
a convection unit generating forced convection exclusively on the first component side, said convection unit transporting the generated thermal energy away from the printed circuit board so as to cool the electronic assembly, and
at least one first cooling element disposed on the first component side and associated with a first electronic component disposed on the first component side or with a first electronic component disposed on the second component side, and
at least one second cooling element disposed on the first component side and associated with a second electronic component disposed on the second component side,
wherein the at least one first cooling element and the at least one second cooling element are connected to a first potential or to a second potential.

2. The electronic assembly of claim 1, wherein the first and second electronic components and the at least one first cooling element are constructed based on surface-mount technology.

3. The electronic assembly of claim 1, wherein the at least one first cooling element is embodied as a flat conductor track or as a metal housing.

4. The electronic assembly of claim 1, further comprising at least one second plated-through hole disposed in the printed circuit board and arranged adjacent to and parallel to the first plated-through hole.

5. The electronic assembly of claim 4, wherein the first plated-through hole or the second plated-through hole are arranged isolated from electrical conductor tracks on the printed circuit board and in closest possible proximity to an electronic component or a group of electronic components.

6. The electronic assembly of claim 4, wherein the first plated-through hole is constructed to conduct electrical current and comprises on the first component side a coating composed of an electrically insulating layer, whereas the second plated-through hole does not conduct electrical current and does not have a coating composed of an electrically insulating layer.

7. The electronic assembly of claim 6, wherein the electrically insulating layer is composed of an insulating film or an insulating lacquer.

8. The electronic assembly of claim 1, wherein the first plated-through hole is constructed to prevent conduction of electrical current.

9. The electronic assembly of claim 1, wherein the first plated-through hole is constructed to conduct electrical current.

10. A method for dissipating heat from an electronic assembly which comprises a printed circuit board having a first component side and a second component side, the method comprising:
transporting thermal energy from the second component side to the first component side by way of a plated-through hold disposed in the printed circuit board,
cooling the second component side using natural convection, and
cooling the first component side using forced convection to transport the thermal energy away from the printed circuit board and to thereby cool the electronic assembly,
wherein at least one first cooling element is disposed on the first component side and associated with a first electronic component disposed on the first component side or with a first electronic component disposed on the second component side, and wherein at least one second cooling element is disposed on the first component side and associated with a second electronic component disposed on the second component side, the method further comprising connecting the at least one first cooling element and the at least one second cooling element to a first potential or to a second potential.

11. The method of claim 10, wherein the plated-through hole does not conduct electrical current.

12. The method of claim 10, wherein the plated-through hole conducts electrical current.

* * * * *

UNITED STATES PATENT AND TRADEMARK OFFICE
CERTIFICATE OF CORRECTION

PATENT NO. : 11,337,299 B2
APPLICATION NO. : 17/428202
DATED : May 17, 2022
INVENTOR(S) : Fabian Diepold et al.

It is certified that error appears in the above-identified patent and that said Letters Patent is hereby corrected as shown below:

In the Claims

In Column 9, Claim 10, Line 56 replace "through hold" with -- through hole --.

Signed and Sealed this
Twenty-eighth Day of June, 2022

Katherine Kelly Vidal
*Director of the United States Patent and Trademark Office*